(12) United States Patent
Rofougaran

(10) Patent No.: US 8,046,621 B2
(45) Date of Patent: *Oct. 25, 2011

(54) METHOD AND SYSTEM FOR GENERATION OF SIGNALS UP TO EXTREMELY HIGH FREQUENCIES USING A DELAY BLOCK

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 660 days.

This patent is subject to a terminal disclaimer.

(21) Appl. No.: 11/860,076

(22) Filed: Sep. 24, 2007

(65) Prior Publication Data
US 2009/0079474 A1 Mar. 26, 2009

(51) Int. Cl.
*G06F 1/04* (2006.01)
(52) U.S. Cl. ......... 713/500; 327/116; 327/122; 455/118
(58) Field of Classification Search .................. 327/116, 327/122; 713/500
See application file for complete search history.

(56) References Cited

U.S. PATENT DOCUMENTS

| | | | |
|---|---|---|---|
| 5,809,064 A | 9/1998 | Fenton | |
| 5,963,071 A * | 10/1999 | Dowlatabadi | 327/175 |
| 5,977,805 A | 11/1999 | Vergnes et al. | |
| 6,259,283 B1 * | 7/2001 | Nguyen | 327/122 |
| 6,370,189 B1 | 4/2002 | Morrison et al. | |
| 6,717,479 B2 * | 4/2004 | Suda | 331/57 |
| 7,005,900 B1 * | 2/2006 | Nguyen | 327/122 |
| 7,173,464 B2 * | 2/2007 | Nagasue | 327/175 |
| 7,495,489 B2 | 2/2009 | Wu | |
| 2002/0153972 A1 | 10/2002 | Hershtig | |
| 2004/0017847 A1 | 1/2004 | Alberth, Jr. et al. | |
| 2006/0141973 A1 | 6/2006 | Behrens | |
| 2007/0273422 A1 | 11/2007 | Kuo | |
| 2008/0232506 A1 | 9/2008 | Fujita | |

OTHER PUBLICATIONS

USPTO Office Action Mailed, Aug. 6, 2009 for U.S. Appl. No. 11/860,152, filed Sep. 24, 2007.
Nov. 4, 2009 Response filed with USPTO in reply to Office Action Mailed, Aug. 6, 2009 for U.S. Appl. No. 11/860,152, filed Sep. 24, 2007.
Ahmadreza Rofougaran, Office Action Mailed Jun. 17, 2010, U.S. Appl. No. 11/860,106, filed Sep. 24, 2007.
Response filed Sep. 26, 2010 in response to Ahmadreza Rofougaran, Office Action Mailed Jun. 17, 2010, U.S. Appl. No. 11/860,106, filed Sep. 24, 2007.
Ahmadreza Rofougaran, Office Action Mailed Nov. 24, 2010, U.S. Appl. No. 11/860,106, filed Sep. 24, 2007.

(Continued)

*Primary Examiner* — Albert Wang
(74) *Attorney, Agent, or Firm* — McAndrews, Held & Malloy, Ltd.

(57) ABSTRACT

Aspects of a method and system for generation of signals up to extremely high frequency using a delay block are provided. In this regard, a first signal may be delayed, via at least a portion of a plurality of delay elements and via a variable capacitance, to generate a second signal that is 90° out of phase relative to the first signal. Additionally, the first signal and second signal may be mixed to generate a third signal, wherein a frequency of the third signal is twice a frequency of said first signal. The portion of the delay elements utilized for delaying the signal may be controlled via one or more switching elements. In this regard, one of the plurality of delay elements may be selected to output the second signal. Moreover, the portion of the delay elements utilized for delaying the signal may be programmably controlled.

27 Claims, 5 Drawing Sheets

OTHER PUBLICATIONS

Ahmadreza Rofougaran, Office Action Mailed Apr. 14, 2010, U.S. Appl. No. 11/860,128, filed Sep. 24, 2007.
Response filed Jul. 15, 2010 in response to Ahmadreza Rofougaran, Office Action Mailed Apr. 14, 2010, U.S. Appl. No. 11/860,128, filed Sep. 24, 2007.
Ahmadreza Rofougaran, Office Action Mailed Aug. 19, 2010 U.S. Appl. No. 11/860,128, filed Sep. 24, 2007.
Response filed Nov. 16, 2010 in response to Ahmadreza Rofougaran, Office Action Mailed Aug. 19, 2010 U.S. Appl. No. 11/860,128, filed Sep. 24, 2007.
Ahmadreza Rofougaran, Office Action Mailed Dec. 8, 2010 U.S. Appl. No. 11/860,128, filed Sep. 24, 2007.

* cited by examiner

METHOD AND SYSTEM FOR GENERATION OF SIGNALS UP TO EXTREMELY HIGH FREQUENCIES USING A DELAY BLOCK

CROSS-REFERENCE TO RELATED APPLICATIONS/INCORPORATION BY REFERENCE

This patent application makes reference to:
U.S. patent application Ser. No. 11/860,106 filed on Sep. 24, 2007;
U.S. patent application Ser. No. 11/860,128 filed on Sep. 24, 2007; and
U.S. patent application Ser. No. 11/860,152 filed on Sep. 24, 2007.

Each of the above stated applications is hereby incorporated herein by reference in its entirety.

FIELD OF THE INVENTION

Certain embodiments of the invention relate to signal processing. More specifically, certain embodiments of the invention relate to a method and system for generation of signals up to extremely high frequency using a delay block.

BACKGROUND OF THE INVENTION

The number and types of wireless devices and wireless standards has seen rapid growth in recent years and is unlikely to slow anytime soon. Consequently, available frequency bands, which are regulated by organizations such as the FCC in the USA, are becoming increasingly scarce. Moreover, existing frequency bands are becoming increasingly congested with wireless traffic from the plethora of users and devices in existence. In this regard, designing devices that can reliably operate in such noisy frequency bands is becoming increasingly difficult and costly. Accordingly, efforts exist to develop wireless technologies which operate at higher, less congested frequencies.

For example, in 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. In this regard, there may be certain drawbacks associated with 60 GHz communications. For example, 60 GHz signals may provide markedly different communications channel and propagation characteristics. In this regard, 60 GHz radiation is partly absorbed by oxygen in the air. Accordingly, 60 GHz communications suffer from increased attenuation with distance as compared to, for example, 2.4 GHz. On the other hand, there may be advantages associated with 60 GHz communications. For example, since a very large bandwidth of 7 GHz is available, very high data rates may be achieved.

Shrinking features size of CMOS processes, for example, is one factor enabling development products and technologies for 60 GHz communications. However, even when fabricated on the smallest processes, conventional methods and circuit topologies are often unable to realize signal generation circuits which can generate signals sufficiently high in frequency to enable technologies such as 60 GHz communications.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for generation of signals up to extremely high frequencies using a delay block, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for generation of signals up to extremely high frequencies using a delay line. In this regard, a first signal may be delayed, via at least a portion of a plurality of delay elements and via a variable capacitance, to generate a second signal that is 90° out of phase relative to the first signal. Additionally, the first signal and second signals may be mixed to generate a third signal, wherein a frequency of the third signal is twice a frequency of said first signal. The portion of the delay elements utilized for delaying the signal may be controlled via one or more switching elements. In this regard, one of the plurality of delay elements may be selected to output the second signal. Moreover, the portion of the delay elements utilized for delaying the signal may be programmably controlled. In this regard, the delay may be coarsely tuned by controlling the portion of the plurality of delay elements. The variable capacitance may be coupled to an output of one or more of said plurality of delay elements. Also, the variable capacitance may be programmably controlled. In this regard, the delay may be finely tuned by controlling the variable capacitance. Also, a plurality of signal processing elements enabled to perform the delaying and mixing may be cascaded.

Figure 1:
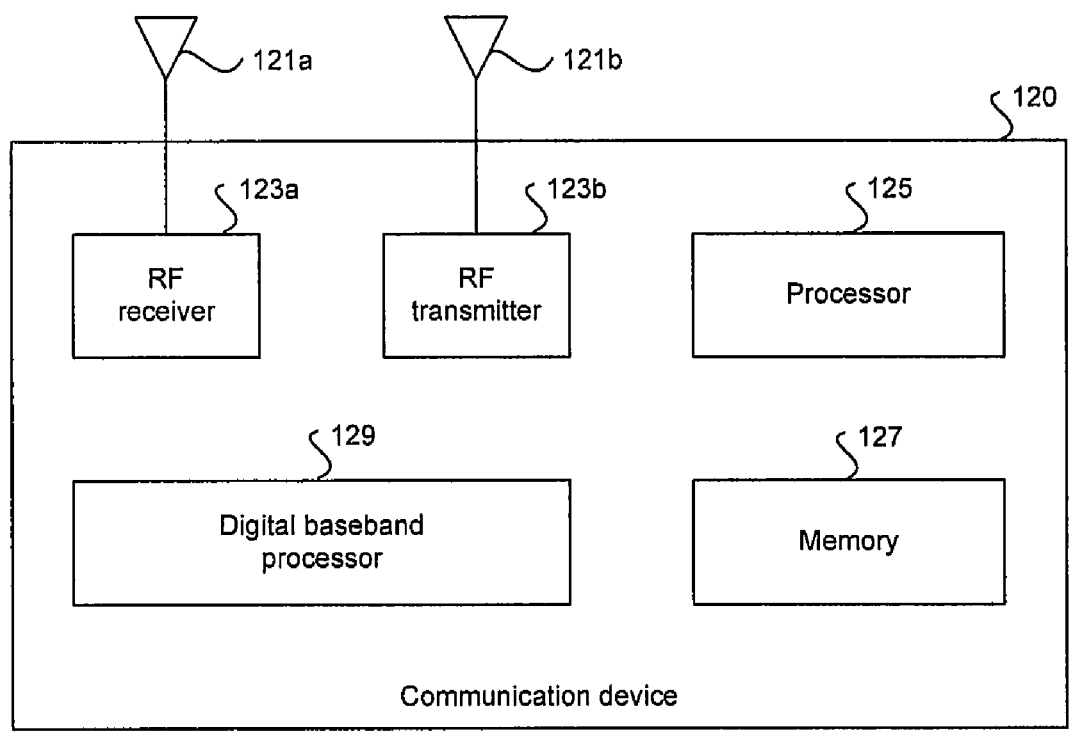
FIG. 1 is a block diagram illustrating an exemplary RF communication device, in accordance with an embodiment of the invention.

FIG. 1 is a block diagram illustrating an exemplary RF communication device, in accordance with an embodiment of the invention. Referring to FIG. 1, there is shown a RF communication device 120 that may comprise an RF receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b. The RF communication device 120 may be operated in a system, such as the cellular network and/or digital video broadcast network, for example.

The RF receiver 123a may comprise suitable logic, circuitry, and/or code that may enable processing of received RF signals. The RF receiver 123a may enable receiving extremely high frequency (EHF) signals at, for example, approximately 60 GHz. In this regard, the receiver may be enabled to generate signals, such as local oscillator signals, for the reception and processing of EHF signals. The RF receiver 123a may down-convert received RF signals to a baseband frequency signal. The RF receiver 123a may perform direct down-conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network.

The RF transmitter 123b may comprise suitable logic, circuitry, and/or code that may enable processing of RF signals for transmission. The RF transmitter 123b may enable transmission of extremely high frequency (EHF) signals at, for example, approximately 60 GHz. In this regard, the receiver may be enabled to generate signals, such as local oscillator signals, for the reception and processing of EHF signals. The RF transmitter 123b may up-convert the baseband frequency signal to an RF signal. The RF transmitter 123b may perform direct up-conversion of the baseband frequency signal to a RF signal of approximately 60 GHz, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the RF communication device 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the RF communication device 120. The processor 125 may also enable executing of applications that may be utilized by the RF communication device 120. For example, the processor 125 may execute applications that may enable displaying and/or interacting with content received via RF signals in the RF communication device 120.

The memory 127 may comprise suitable logic, circuitry, and/or code that may enable storage of data and/or other information utilized by the RF communication device 120. For example, the memory 127 may be utilized for storing processed data generated by the digital baseband processor 129 and/or the processor 125. The memory 127 may also be utilized to store information, such as configuration information, that may be utilized to control the operation of at least one block in the RF communication device 120. For example, the memory 127 may comprise information necessary to configure the RF receiver 123a to enable receiving signals in the appropriate frequency band.

Figure 2:
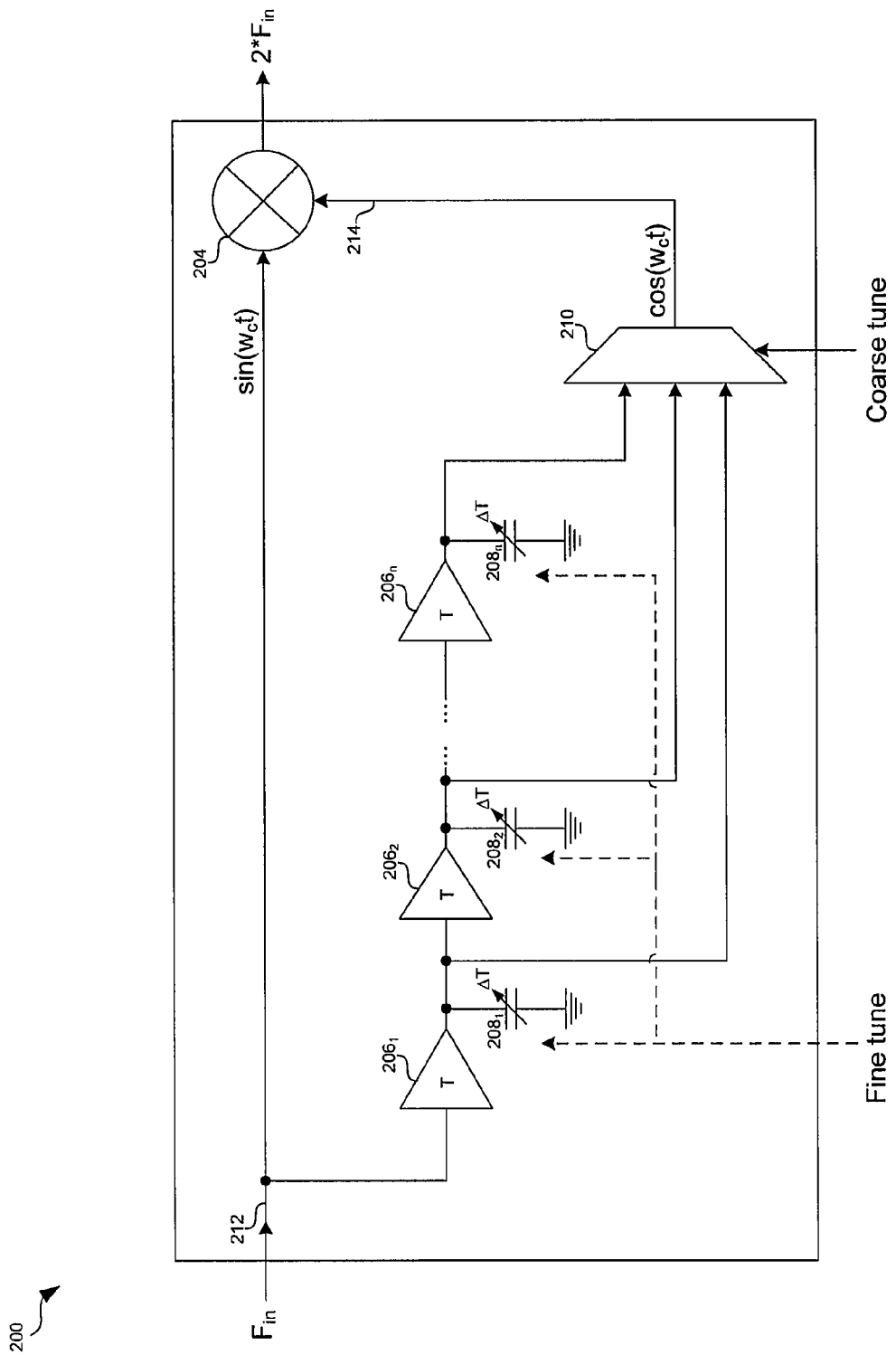
FIG. 2 is a block diagram illustrating the use of a delay block for the generation of signals of up to extremely high frequencies, in accordance with an embodiment of the invention.

FIG. 2 is a block diagram illustrating the use of a delay block for the generation of signals of up to extremely high frequencies, in accordance with an embodiment of the invention. Referring to FIG. 2 there is shown a delay block 200 which may comprise a plurality of delay elements 206, a plurality of capacitances 208, a switching element 210, and a mixer 204.

The delay elements 206 may comprise suitable logic, circuitry, and/or code that may enable delaying an RF signal. In an exemplary embodiment of the invention, the delay elements 206 may comprise CMOS buffers and/or inverters. Additionally, there may be 'n' delay elements $206_1$, $206_2$, . . . , $206_n$. In one embodiment of the invention, each delay element 206 may introduce a time delay 'T'. In other embodiments of the invention, each of the delay elements 206 may be enabled to generate a fixed phase delay. Accordingly, in one aspect of the invention, a plurality of the delay elements may be configured so as to generate a variable delay.

Each of the capacitances 208 may comprise one or more capacitors which may be programmably controlled. In one embodiment of the invention, each capacitance 208 may comprise a plurality of capacitors coupled via a switch network. Accordingly, the capacitance may be controlled via a digital control word. In another embodiment of the invention, each capacitance 208 may comprise one or more varactors which may be programmably controlled via one or more voltages.

The switching element 210 may comprise suitable logic, circuitry, and/or code that may enable selecting which delay element 206 output to route to the mixer 204. An amount by which a signal is delayed may be proportional to the number of delay elements 206 through which the signal propagates. In this manner, the amount of delay introduced may be coarsely tuned by altering the number of delay elements through which a signal propagates. Accordingly, a number of delay elements which introduces a delay closest to 90° may be selected.

The mixer 204 may comprise suitable logic, circuitry, and/or code that may enable generation of inter-modulation products resulting from mixing the input signal 212 and the delayed signal 214. In various embodiments of the invention the output of the mixer may be filtered such that desired intermodulation products are passed with less attenuation than undesired intermodulation products. For example, the output may be bandpass filtered with a center frequency of $2*F_{in}$.

Figure 3:
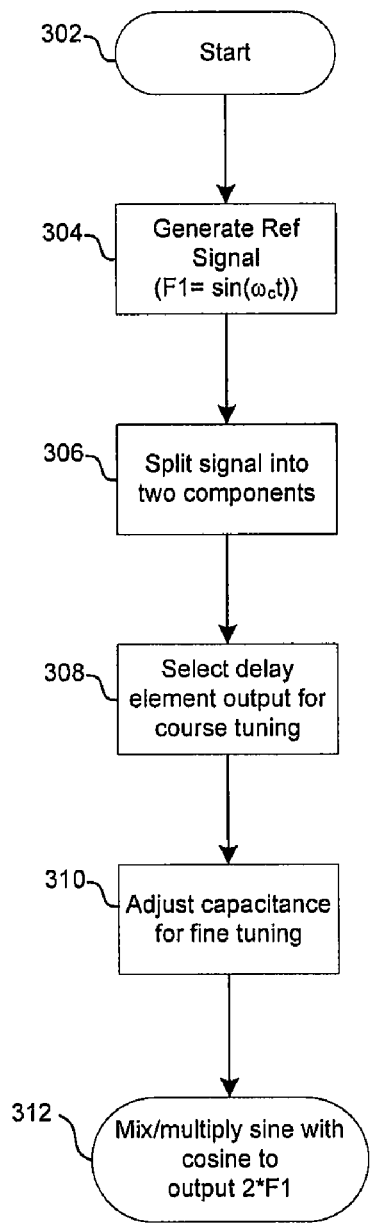
FIG. 3 is a flow chart illustrating exemplary steps for generating signals utilizing a delay block, in accordance with an embodiment of the invention.

In operation, the delay block 200 may enable doubling the frequency of an input signal 212. In this regard, the input signal 212 of frequency, $F_{in}$, may be represented as $\sin(\omega_c t)$, where '$\omega_c$' is angular frequency and 't' is time. The input signal 212 may be coupled to the mixer 204 and a first of one or more delay elements 206. The one or more delay elements 206 combined with one or more capacitances 208 may enable delaying $F_{in}$ by 90°, thus generating a signal which may be represented as $\cos(\omega_c t)$. In this regard, controlling the number of delay elements 206 through which the signal propagates may enable course control of the amount of delay. Additionally, controlling the amount of capacitance 208 may enable fine control of the amount of delay. The delayed signal 214 may be applied to a second input of the mixer 204. Accordingly, mixing a signal that may be represented by $\sin(\omega_c t)$ with signal that may be represented by $\cos(\omega_c t)$ may result in a signal that may be represented by $\sin(2\omega_c t)$ FIG. 3 is a flow chart illustrating exemplary steps for generating signals utilizing a delay block, in accordance with an embodiment of the invention. Referring to FIG. 3 the exemplary steps may begin with start step 302. subsequent to step 302 the exemplary steps may advance to step 304. In step 304, a reference signal may be generated by, for example, a phase locked loop (PLL), a direct digital frequency synthesizer (DDFS), or other signal generation block. In this regard, the reference signal may be of frequency F1. Subsequent to step 304, the exemplary steps may advance to step 306. In step 306, the reference signal may be replicated or split resulting in two identical (or nearly identical) signals. Subsequent to step 306, the exemplary steps may advance to step 308. In step 308, a number of delay elements comprising a delay chain may be selected such that the first signal may be delayed by approximately 90° relative to the second signal. Subsequent to step 308, the exemplary steps may advance to step 310. In step 310, a capacitance coupled to the second signal may be adjusted such that the delay of the first signal is more precisely equal to 90°. In this manner, the first signal may be equal to $\cos(\omega_c t)$ while the second (non-delayed) signal may be equal to $\sin(\omega_c t)$. Subsequent to step 312 the exemplary steps may advance to step 312. In step 312, the first signal ($\cos(\omega_c t)$) may be mixed or multiplied with the second signal ($\sin(\omega_c t)$) to output a signal of $\sin(2\omega_c t)$ which has frequency 2*F1.

Figure 4:
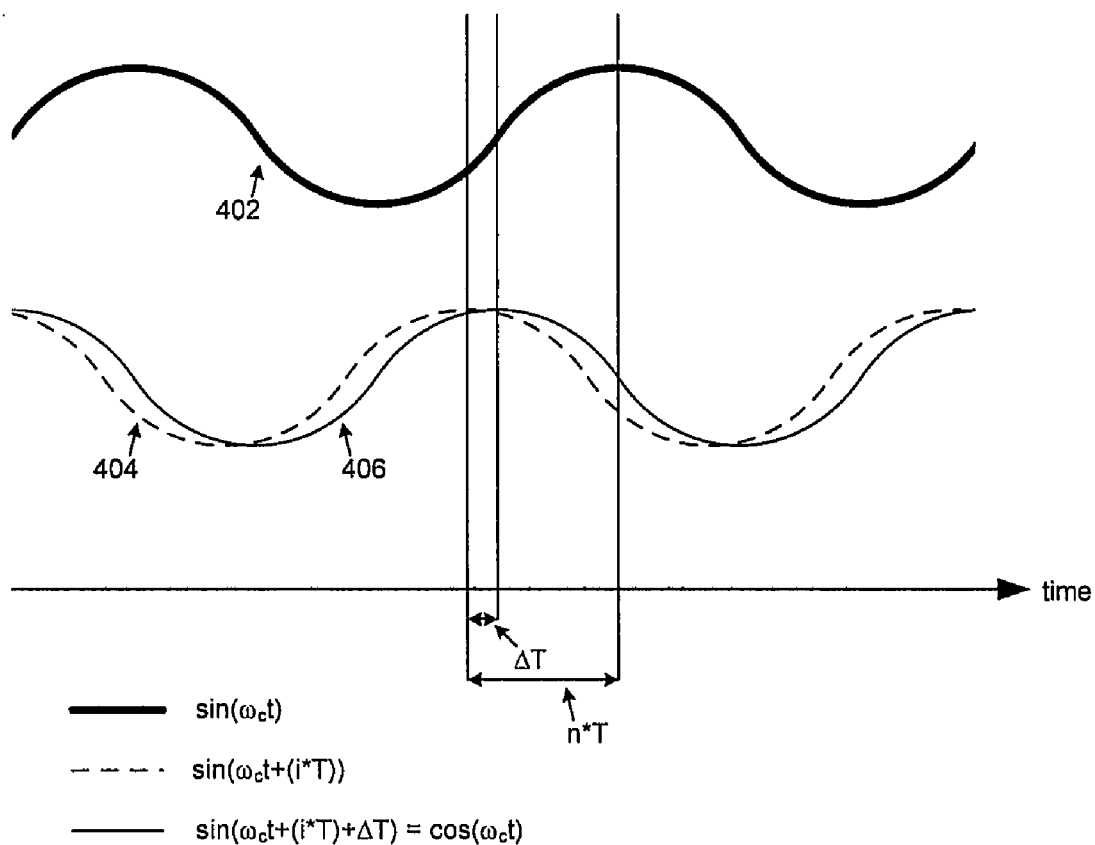
FIG. 4 is a diagram illustrating operation of a delay block, in accordance with an embodiment of the invention.

FIG. 4 is a diagram illustrating operation of a delay block, in accordance with an embodiment of the invention. Referring to FIG. 4, there is shown a sine wave 402, and two delayed signals 404 and 406.

The sine wave 402 may, for example, comprise a reference signal such as the input signal 212 of FIG. 2. In this regard, the sine wave 402 may be output by a signal generator circuit such as a phase locked loop (PLL) or a direct digital frequency synthesizer (DDFS). In this regard, a maximum frequency of the sine wave 402 may be limited due to limitations of the signal generation circuit. Accordingly, by utilizing high speed delay blocks and a mixer, higher frequencies may be generated from the signal 402.

The signal 404 may comprise a delayed version of the signal 402. In this regard, the signal 404 may be delayed by an integer multiple of fixed time periods, T. Accordingly, the signal 404 may be the output of a cascade of one or more delay elements 206. In this manner, by controlling the number of delay elements 206 through which the signal 402 propagates, the signal 404 may be delayed by an amount roughly equal to 90° relative the signal 402.

The signal 406 may comprise a delayed version of the signal 402. In this regard, the signal 406 may be delayed by an integer multiple of fixed time periods, T, plus an amount ΔT. Accordingly, the signal 406 may be the output of a cascade of one or more delay elements 206 with one or more capacitances 208 coupled to the output of the one or more delay elements. In this manner, by controlling the capacitance 208, the signal 406 may be delayed by an amount more precisely equal to 90° relative the signal 402.

Figure 5:
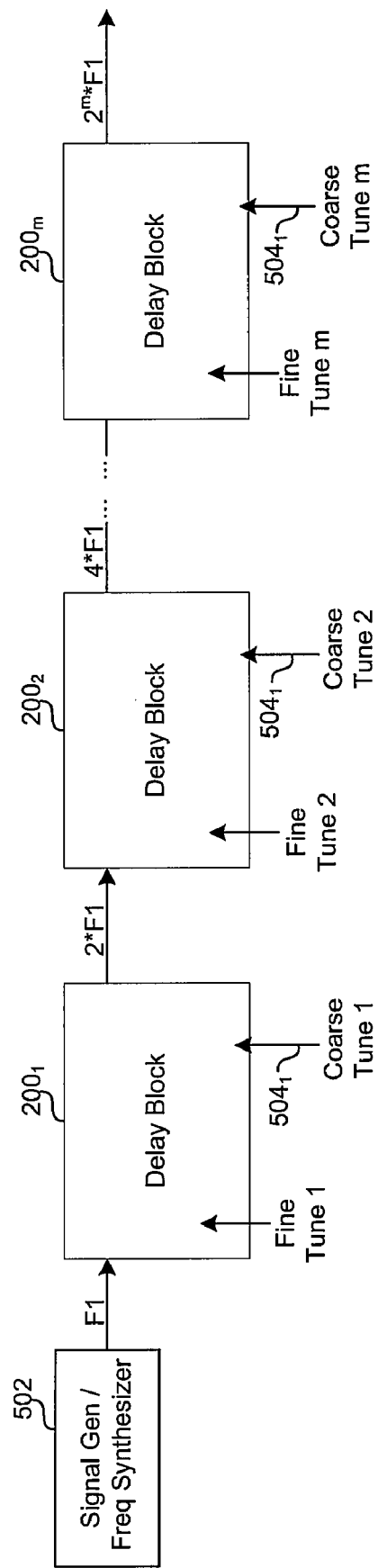
FIG. 5 is a block diagram illustrating the cascading of multiple delay blocks, in accordance with an embodiment of the invention.

FIG. 5 is a block diagram illustrating the cascading of multiple delay blocks, in accordance with an embodiment of the invention. Referring to FIG. 5 there is shown a signal generator 502 and a plurality of delay blocks $200_1, \ldots, 200_m$.

The signal generator 502 may comprise suitable logic, circuitry, and/or code that may enable generating a sine wave. In this regard, the signal generator 502 may be enabled to generate a reference frequency for use, for example, as a local oscillator. For example, the signal generator 502 may comprise one or more PLLs. Accordingly, the maximum frequency which the signal generator 502 may be capable of generating may be limited.

Each of the 'm' delay blocks $200_1, \ldots, 200_m$ may be as described in FIG. 2. Accordingly each delay block $200_i$ may be enabled to output a signal of 2 times the frequency of a signal input to delay block $200_i$. Accordingly, the frequency of the $m^{th}$ delay block may be equal to $$F_{out} = 2^m \cdot F_{in} \qquad \text{EQ. 1}$$

where $F_{in}$ is the input to the first delay block and $F_{out}$ is the output frequency of the $m^{th}$ delay block.

In operation, each delay block $200_1, \ldots, 200_m$ may be controlled via a course control input and a fine control input. In this regard, the course control input of the $i^{th}$ delay block may control the number of delay elements comprising the delay block $200_i$ through which the signal propagates. Additionally the fine control input of the $i^{th}$ delay block $200_i$ may control the capacitance at the output of one or more delay elements comprising the block $200_i$. In this regard, the coarse control and/or fine control inputs may be manually controlled or programmably controlled via, for example, one or more processors, such as the processor 125.

Aspects of a method and system for generation of signals up to extremely high frequency using a delay block are provided. In this regard, a first signal, such as the signal 212 of FIG. 2, may be delayed, via at least a portion of a plurality of delay elements, such as the delay elements $206_1, \ldots, 206_n$ of FIG. 2, and via a variable capacitance, such as the variable capacitance $208_1, \ldots, 208_n$, to generate a second signal that is 90° out of phase relative to the first signal. Additionally, the first signal and second signal may be mixed to generate a third signal, wherein a frequency of the third signal is twice a frequency of said first signal. The portion of the delay elements utilized for delaying the signal may be controlled via one or more switching elements, such as the switching element 210. In this regard, one of the delay elements may be selected to output the second signal. Moreover, the portion of the delay elements utilized for delaying the signal may be programmably controlled. In this regard, the delay may be coarsely tuned by controlling the portion of the plurality of delay elements utilized for delaying the signal. The variable capacitance may be coupled to an output of one or more of said plurality of delay elements. Also, the variable capacitance may be programmably controlled. In this regard, the delay may be finely tuned by controlling the variable capacitance. Also, a plurality of signal processing elements enabled to perform the delaying and mixing may be cascaded, as depicted in FIG. 5, for example.

Another embodiment of the invention may provide a machine-readable storage, having stored thereon, a computer program having at least one code section executable by a machine, thereby causing the machine to perform the steps as described herein for generation of signals up to extremely high frequency using a delay block.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   delaying a first signal via a at least a portion of a plurality of delay elements and a variable capacitance to generate a second signal that is 90° phase shifted relative to said first signal; and
   mixing said first signal with said second signal to generate a third signal wherein:
      a frequency of said third signal is twice a frequency of said first signal; and
      said delaying is controlled to maximize the strength of said third signal.

2. The method according to claim 1, comprising controlling said at least a portion of said delay elements via one or more switching elements.

3. The method according to claim 1, comprising selecting one of said plurality of delay elements for outputting said second signal.

4. The method according to claim 1, comprising programmably controlling said at least a portion of said plurality of delay elements.

5. The method according to claim 1, wherein said variable capacitance is communicatively coupled to an output of one or more of said plurality of delay elements.

6. The method according to claim 1, comprising programmably controlling said variable capacitance.

7. The method according to claim 1, comprising cascading a plurality of processing elements enabled to perform said delaying and said mixing of said signals.

8. The method according to claim 1, comprising controlling said at least a portion of said delay elements to coarsely tune said delaying of said first signal.

9. The method according to claim 1, comprising controlling said variable capacitance to finely tune said delaying of said first signal.

10. A machine-readable storage having stored thereon, a computer program having at least one code section for signal processing, the at least one code section being executable by a machine for causing the machine to perform steps comprising:
    delaying a first signal via a at least a portion of a plurality of delay elements and a variable capacitance to generate a second signal that is 90° phase shifted relative to said first signal; and
    mixing said first signal with said second signal to generate a third signal wherein:
       a frequency of said third signal is twice a frequency of said first signal; and
       said delaying is controlled to maximize the strength of said third signal.

11. The machine-readable storage according to claim 10, wherein said at least one code section enables controlling said at least a portion of said delay elements via one or more switching elements.

12. The machine-readable storage according to claim 10, wherein said at least one code section enables selecting one of said plurality of delay elements for outputting said second signal.

13. The machine-readable storage according to claim 10, wherein said at least one code section enables programmably controlling said at least a portion of said plurality of delay elements.

14. The machine-readable storage according to claim 10, wherein said variable capacitance is communicatively coupled to an output of one or more of said plurality of delay elements.

15. The machine-readable storage according to claim 10, wherein said at least one code section enables programmably controlling said variable capacitance.

16. The machine-readable storage according to claim 10, wherein said at least one code section enables cascading a plurality of processing elements enabled to perform said delaying and said mixing of said signals.

17. The machine-readable storage according to claim 10, wherein said at least one code section enables controlling said at least a portion of said delay elements to coarsely tune said delaying of said first signal.

18. The machine-readable storage according to claim 10, wherein said at least one code section enables controlling said variable capacitance to finely tune said delay of said first signal.

19. A system for signal processing, the system comprising:
    one or more circuits that delay a first signal via a at least a portion of a plurality of delay elements and a variable capacitance to generate a second signal that is 90° phase shifted relative to said first signal; and
    said one or more circuits mix said first signal with said second signal to generate a third signal wherein:
       a frequency of said third signal is twice a frequency of said first signal; and
       said delay is controlled to maximize the strength of said third signal.

20. The system according to claim 19, wherein said one or more circuits control said at least a portion of said delay elements via one or more switching elements.

21. The system according to claim 19, wherein said one or more circuits enable select one of said plurality of delay elements for outputting said second signal.

22. The system according to claim 19, wherein said one or more circuits programmably control said at least a portion of said plurality of delay elements.

23. The system according to claim 19, wherein said variable capacitance is communicatively coupled to an output of one or more of said plurality of delay elements.

24. The system according to claim 19, wherein said one or more circuits programmably control said variable capacitance.

25. The system according to claim 19, wherein said one or more circuits enable cascading a plurality of processing elements enabled to perform said delaying and said mixing of said signals.

26. The system according to claim 19, wherein said one or more circuits control said at least a portion of said delay elements to coarsely tune said delaying of said first signal.

27. The system according to claim 19, wherein said one or more circuits control said variable capacitance to finely tune said delay of said first signal.

* * * * *